United States Patent
Hong et al.

(10) Patent No.: US 7,683,383 B2
(45) Date of Patent: Mar. 23, 2010

(54) LIGHT EMITTING DEVICE HAVING CIRCUIT PROTECTION UNIT

(75) Inventors: Steve Meng-Yuan Hong, Hsinchu (TW); Jen-Shui Wang, Hsinchu (TW); Tzu-Feng Tseng, Hsinchu (TW); Ching-San Tao, Hsinchu (TW); Wen-Huang Liu, Hsinchu (TW); Min-Hsun Hsieh, Hsinchu (TW)

(73) Assignee: Epistar Corporation, Hsinchu (TW)

(*) Notice: Subject to any disclaimer, the term of this patent is extended or adjusted under 35 U.S.C. 154(b) by 638 days.

(21) Appl. No.: 11/222,922

(22) Filed: Sep. 8, 2005
(Under 37 CFR 1.47)

(65) Prior Publication Data

US 2006/0081857 A1   Apr. 20, 2006

(30) Foreign Application Priority Data

Oct. 8, 2004   (TW) .............................. 93130813 A

(51) Int. Cl.
*H01L 27/15*   (2006.01)
*H01L 29/16*   (2006.01)

(52) U.S. Cl. .............................. 257/84; 257/85; 257/90; 257/94; 257/96; 257/97; 257/355

(58) Field of Classification Search ................. 257/84, 257/85, 94, 99, 103, 90, 96, 97
See application file for complete search history.

(56) References Cited

U.S. PATENT DOCUMENTS

| | | | |
|---|---|---|---|
| 6,023,076 A | 2/2000 | Shibata | 257/94 |
| 6,693,352 B1 * | 2/2004 | Huang et al. | 257/743 |
| 7,095,765 B2 * | 8/2006 | Liu et al. | 372/38.09 |
| 7,151,281 B2 * | 12/2006 | Shei et al. | 257/79 |
| 2002/0179941 A1 | 12/2002 | Ootake et al. | 257/210 |
| 2003/0136970 A1 * | 7/2003 | Takeya et al. | 257/90 |
| 2005/0218414 A1 * | 10/2005 | Ueda et al. | 257/94 |

* cited by examiner

*Primary Examiner*—Kenneth A Parker
*Assistant Examiner*—Joseph Nguyen
(74) *Attorney, Agent, or Firm*—J.C. Patents

(57) ABSTRACT

A light emitting device having a circuit protection unit is provided. The circuit protection unit has a low-resistance layer and a potential barrier layer, wherein a barrier potential exists at the interface between the low-resistance layer and the potential barrier layer. The circuit protection unit is electrically connected with the light emitting device. When an electrostatic discharge or excessive forward current is occurred in the light emitting device, the circuit protection unit provides a rectifying function for preventing damages caused by static electricity or excessive forward current to the light emitting device.

68 Claims, 6 Drawing Sheets

LIGHT EMITTING DEVICE HAVING CIRCUIT PROTECTION UNIT

CROSS-REFERENCE TO RELATED APPLICATION

This application claims the priority benefit of Taiwan application serial no. 93130813, filed on Oct. 8, 2004. All disclosure of the Taiwan application is incorporated herein by reference.

BACKGROUND OF THE INVENTION

1. Field of the Invention

The present invention relates to a light emitting device, and in particular, to a light emitting device having a circuit protection unit.

2. Description of the Related Art

The light emitting device is widely used in some applications, for example, it can be used in optical displays, laser diodes, traffic signals, data storage devices, communication devices, illumination devices, and medical equipment. In this field, in order to improve the yield rate of the light emitting diodes, the prevention of electrostatic damages to light emitting devices is nowadays an important task to technical personnel.

As shown in FIG. 1, in order to prevent a conventional light emitting device from electrostatic damage, the light emitting diode reversely parallel connects with a circuit protection unit such as a Zener diode 50 during the packaging process. As a result, static electricity is released by the Zener diode 50, thereby preventing damage to light emitting device. However, the circuit protection unit is electrically connected with the light emitting device during the packaging process, i.e., the light emitting device is not protected by the circuit protection unit before the packaging process. Specifically, the light emitting device is not protected by the circuit protection unit adequately during the chip manufacturing process of the light emitting device. Moreover, the light emitting device packaging process described above is complex and the manufacturing cost is high.

As shown in US Patent Publication No. 20020179941, a light emitting device with protection against electrostatic damage is disclosed. As shown in FIG. 2, a shunt diode with a doped-silicon base is electrically connected with a light emitting diode. During electrostatic discharging, the discharge current is conducted by the shunt diode with a doped-silicon base, and thus the discharge current is prevented from passing through the light emitting diode. Because the light emitting diode chip is soldered with the shunt diode after dicing, the damage caused by electrostatic discharge during the manufacturing of the light emitting diode is still unavoidable. Furthermore, the manufacturing process requires an additional procedure for soldering the light emitting diode with the shunt diode, thus incurring a relatively high cost.

As shown in U.S. Pat. No. 6,023,076, a nitride-based light emitting diode is disclosed. The first electrode of the light emitting diode is connected to the first semiconductor layer and the second semiconductor layer. A Schottky contact is formed between the first electrode and the second semiconductor layer. When a reverse current occurs, the current is directed from the first electrode to the second semiconductor layer and towards the second electrode, rather than passing through the light emitting diode, so as to prevent damage. The second semiconductor layer is used as a channel to conduct the reverse current. Therefore, the reverse current may pass through the light emitting diode directly and the light emitting diode is damaged when the reverse current becomes excessive.

SUMMARY OF THE INVENTION

The present invention provides a light emitting device having a circuit protection unit. The circuit protection unit includes a low-resistance layer and a potential barrier layer. A barrier potential exists at the interface between the low-resistance layer and the potential barrier layer. The interface may be a Schottky contact or a p-n junction. The barrier potential between the low-resistance layer and the potential barrier layer has the following possibilities:

1. When the low-resistance layer material is a metal with work function $\Phi L$, and the potential barrier layer is an n-type semiconductor material with work function $\Phi B$, the barrier potential=$\Phi L - \Phi B$, wherein $\Phi L > \Phi B$.

2. When the low-resistance layer material is a metal with work function $\Phi L$, and the potential barrier layer is a p-type semiconductor material with work function $\Phi B$, the barrier potential=$\Phi B - \Phi L$, wherein $\Phi L < \Phi B$.

3. When the low-resistance layer material is a transparent conductive oxide layer (TCO) with work function $\Phi L$, such as ITO, CTO, $Zn_2SnO_4$, $ZnSnO_3$, $MgIn_2O_4$, $Zn_2In_2O_5$, $In_4Sn_3O_{12}$, $AgInO_2Sn$ or $In_2O_3Zn$ and other similar compounds, and the potential barrier layer is an n-type semiconductor material with work function $\Phi B$, the barrier potential=$\Phi L - \Phi B$, wherein $\Phi L > \Phi B$.

4. When the low-resistance layer material is a transparent conductive oxide layer with work function $\Phi L$, and the potential barrier layer is a p-type semiconductor material with work function $\Phi B$, the barrier potential=$\Phi B - \Phi L$, wherein $\Phi L < \Phi B$.

5. When the low-resistance layer material is an n-type semiconductor material with work function $\Phi L$, and the potential barrier layer is a p-type semiconductor material with work function $\Phi B$, the barrier potential=$\Phi B - \Phi L$, wherein $\Phi L < \Phi B$.

Due to the above-mentioned combinations of a low-resistance layer with a potential barrier layer, the forward threshold voltage of the circuit protection unit is high and the reverse breakdown voltage of the circuit protection unit is low. The circuit protection unit with rectification function is integrated in the light emitting device such that the damage resulted from an electrostatic discharge or excessive forward current is prevented or mitigated effectively.

Specifically, the forward bias voltage and breakdown voltage of the circuit protection unit are Vsf and Vsr respectively. The forward operating voltage, forward damage voltage, and breakdown voltage of light emitting device are Vf, Vfd, and Vr respectively, wherein Vf<|Vsf|<Vfd, |Vsr|<|Vr|. When the light emitting device is driven by the forward operating voltage Vf and the forward operating voltage Vf<|Vsf|, the circuit protection unit is turned off. When the light emitting device is driven by a forward operating voltage higher than Vfd, the circuit protection unit is turned on because of |Vsf|<Vfd. As a result, the excessive forward current is prevented from passing through and damaging the light emitting device, and the light emitting device is protected by the circuit protection unit. On the other hand, when the light emitting device is driven by a reverse operating voltage, the circuit protection unit is turned on (the reverse operating voltage=Vsr) before the reverse operating voltage reaches Vr because of $|Vsr|<|Vr|$. As a result, the excessive reverse current is prevented from passing through and damaging the light emitting device, and the light emitting device is still protected by the circuit protection unit.

Additionally, the circuit protection unit of the present invention is manufactured by a conventional chip manufacturing process. There is no need to bond a Zener diode or a shunt diode with the light emitting diode during the packaging process. Besides, the light emitting diode having the circuit protection unit of the present invention can be a flip chip type light emitting device such that the Zener diode can be omitted to reduce manufacturing complexity and cost.

Furthermore, the light emitting diode of the present invention has a circuit protection unit for preventing the electrostatic damage during manufacturing. As a result, the stringent requirements for environmental to reduce electrostatic discharge is relaxed. In addition, the yield rate for light emitting diodes is greatly improved.

The present invention describes a light emitting device having a circuit protection unit. The light emitting device includes a light emitting stacking layer having a first surface and a second surface and the circuit protection unit. Furthermore, the circuit protection unit includes a low-resistance layer and a potential barrier layer, wherein a barrier potential exists at the interface between the low-resistance layer and the potential barrier layer. The circuit protection uni forms an electrical connection with each of the first surface and the second surface of the light emitting stacking layer, thus accomplishing a rectifying function.

In a light emitting diode in accordance with the present invention, the first surface and the second surface are located on the same side of the light emitting stacking layer. In addition, the first surface and the second surface can also be disposed on opposite sides (for example, front side and back side) of the light emitting stacking layer.

In a light emitting diode of the present invention, the interface between the low-resistance layer and the potential barrier layer may be a Schottky contact or a p-n junction.

In an embodiment of the present invention, the material of the low-resistance layer includes Ni/Au, NiO/Au, TiWN, ITO, CTO, $SnO_4Sb$, $ZnSnO_3$, $In_4Sn_3O_{12}$, $Zn_2SnO_4$, or any other equivalent material.

In an embodiment of the present invention, the material of the potential barrier layer includes $TiO_2$, $SrTiO_3$, $MnTiO_3$, $BaTiO_3$, $ZrO_2$, $Nb_2O_5$, $KtaO_3$, $WO_3$, $Fe_2O_3$, ZnO, $SnO_2$, GaP, Si, SiC, CdSe, CdS or any other equivalent material.

In an embodiment of the present invention, the potential barrier layer includes p-type dopant such as Mg, Zn, Be, Cr, or any other equivalent material. In another embodiment of the present invention, the potential barrier layer includes an n-type dopant such as Si, Ge, Sn, Te, O, S, C, or any other equivalent material.

A light emitting diode of the present invention includes a first stacking layer, a light emitting layer, and a second stacking layer having a first surface. The first stacking layer has a second surface layer. The light emitting layer is formed on the first stacking layer. Furthermore, the second stacking layer is formed on the light emitting layer. The material of the first stacking layer includes AlInP, GaN, AlGaN, InGaN or any other equivalent material. The material of the light emitting layer includes a compound selected from the GaN-based III-N group such as AlGaInP, GaN, InGaN, AlInGaN, or any other equivalent material. The material of the second stacking layer includes a GaN-based III-N group compound such as GaN, AlGaN, InGaN, AlInP, or any other equivalent material.

The circuit protection unit is disposed on a first contact region of the first surface. The low-resistance layer of the circuit protection unit contacts with the first surface and electrically connects with the second surface.

The light emitting device further includes a second circuit protection unit disposed on a contact region of the second surface. The second circuit protection unit includes a second low-resistance layer and a second potential barrier layer. The interface between the second low-resistance layer and the second potential barrier layer is a Schottky contact or a p-n junction. The second low-resistance layer contacts with the second surface.

The material of the second low-resistance layer includes Ni/Au, NiO/Au, TiWN, TCO, ITO, CTO, $SnO_2Sb$, $ZnSnO_3$, $In_4Sn_3O_{12}$, $Zn_2SnO_4$, or any other similar material.

The material of the second potential barrier layer includes $TiO_2$, $SrTiO_3$, $MnTiO_3$, $BaTiO_3$, $ZrO_2$, $Nb_2O_5$, $KTaO_3$, $WO_3$, $Fe_2O_3$, ZnO, $SnO_2$, GaP, Si, SiC, CdSe CdS, or any other similar material.

In an embodiment of the present invention, the second potential barrier layer includes a p-type dopant such as Mg, Zn, Be, Cr, or any other similar material. In another embodiment of the present invention, the second potential barrier layer includes an n-type dopant such as Si, Ge, Sn, Te, O, S, C, or any other similar material.

A light emitting device of the present invention further includes a first electrode disposed on the second contact region of the first surface and a second electrode disposed on the second contact region of the second surface. The circuit protection unit and the first electrode are electrically connected. In addition, the second circuit protection unit and the second electrode are electrically connected.

In the above-mentioned light emitting device of the present invention, the low-resistance layer is disposed on the first surface of the light emitting stacking layer. Furthermore, the first electrode is disposed on the first contact region of the low-resistance layer. The potential barrier layer is disposed on the second contact region of the low-resistance layer.

In the above-mentioned light emitting device of the present invention, the second low-resistance layer is disposed on the second surface of the light emitting stacking layer. In addition, the second electrode is disposed on the first contact region of the second low-resistance layer. The potential barrier layer is disposed on the second contact region of the second low-resistance layer.

The light emitting device of the present invention further includes a plurality of other circuit protection units disposed on the circuit protection unit or the second circuit protection unit.

BRIEF DESCRIPTION OF THE DRAWINGS

The accompanying drawings, which are incorporated herein and form a part of the specification, illustrate the present invention, and together with the description, further serve to explain the principles of the invention and to enable a person skilled in the pertinent art to make and use the invention.

DESCRIPTION OF THE EMBODIMENTS

Figure 1:
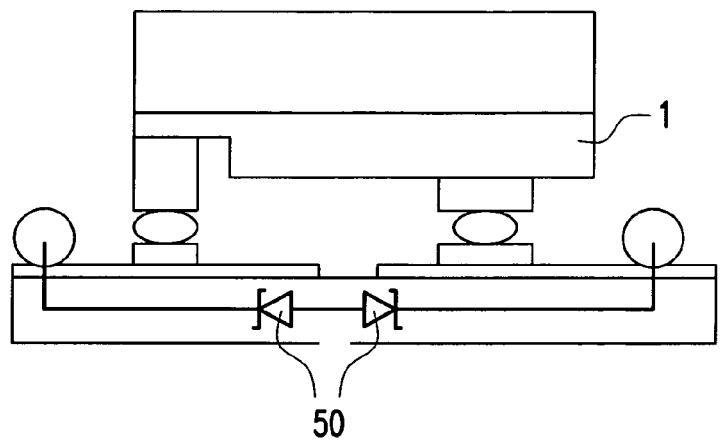
FIG. 1 is a schematic diagram illustrating a conventional light emitting device.
Figure 2:
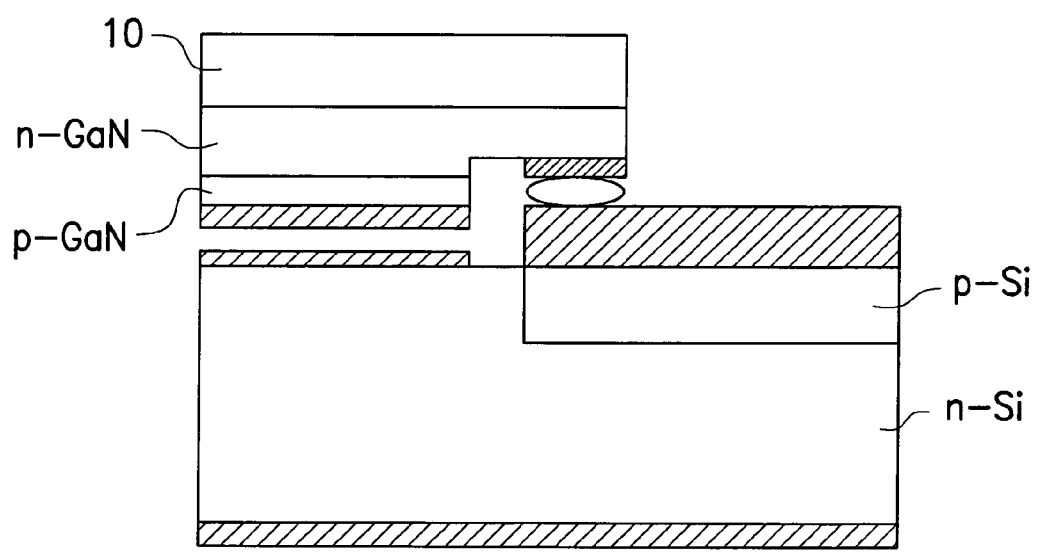
FIG. 2 is a schematic diagram illustrating a conventional light emitting device.
Figure 3:
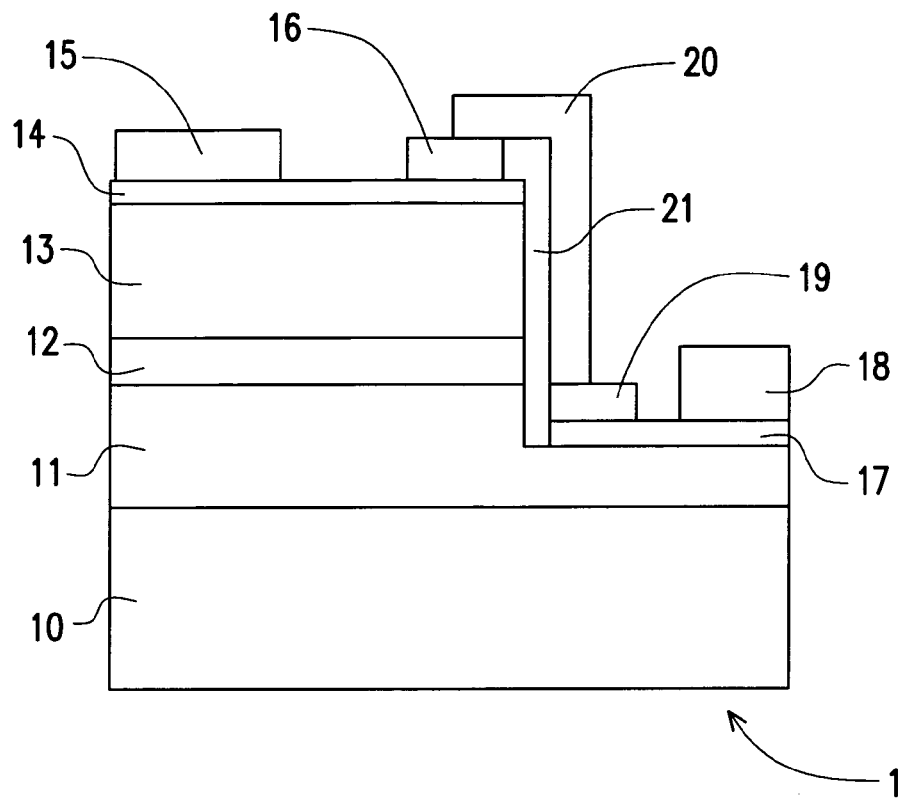
FIG. 3 is a schematic diagram illustrating a light emitting device having a circuit protection unit in accordance with a first embodiment of the present invention.

Referring to FIG. 3, a light emitting device 1 having circuit protection unit in accordance with a preferred embodiment of the present invention includes a substrate 10, a first stacking layer 11, a light emitting layer 12, a second stacking layer 13, a first low-resistance layer 14, a first electrode 15, a first potential barrier layer 16, a second low-resistance layer 17, a second electrode 18, a second potential barrier layer 19, and an electrical connecting layer 20. In the present embodiment, the first stacking layer 11 is disposed on the substrate 10, wherein the first stacking layer 11 includes a first epitaxial region and a second surface region. The light emitting layer 12 is disposed on the first epitaxial region and the second stacking layer 13 is disposed on the light emitting layer 12. Moreover, the first low-resistance layer 14 is disposed on the second stacking layer 13, wherein the first low-resistance layer 14 includes a first contact region and a second contact region. The first electrode 15 is disposed on the first contact region such that an ohmic contact is formed at the interface of the first low-resistance layer 14 and the first electrode 15. In addition, the first potential barrier layer 16 is disposed on the second contact region such that a barrier potential exists at the interface between the first low-resistance layer 14 and the potential barrier layer 16. The interface between the first low-resistance layer 14 and the first potential barrier layer 16 can be a Schottky contact or a p-n junction. The second low-resistance layer 17 is disposed on the second surface region, wherein the second low-resistance layer 17 includes a third contact region and a fourth contact region. A second electrode 18 is disposed on the third contact region such that an ohmic contact is formed at the interface between the second low-resistance layer 17 and the second electrode 18. Furthermore, the second potential barrier layer 19 is disposed on the fourth contact region such that a barrier potential exists at the interface between the second low-resistance layer 17 and the second potential barrier layer 19. The interface between the second low-resistance layer 17 and the second potential barrier layer 19 can be a Schottky contact or a p-n junction. The electrical connecting layer 20 electrically connects the first potential barrier layer 16 and the second potential barrier layer 19 such that a circuit protection unit is formed by the electrical connecting layer 20, the first potential barrier layer 16, and the second potential barrier layer 19. An insulating layer 21 is formed over a portion of the first stacking layer 11, the light emitting layer 12, and the second stacking layer 13 such that the electrical connecting layer 20 is electrically isolated from the first stacking layer 11, the light emitting layer 12, and the second stacking layer 13.

Figure 4:
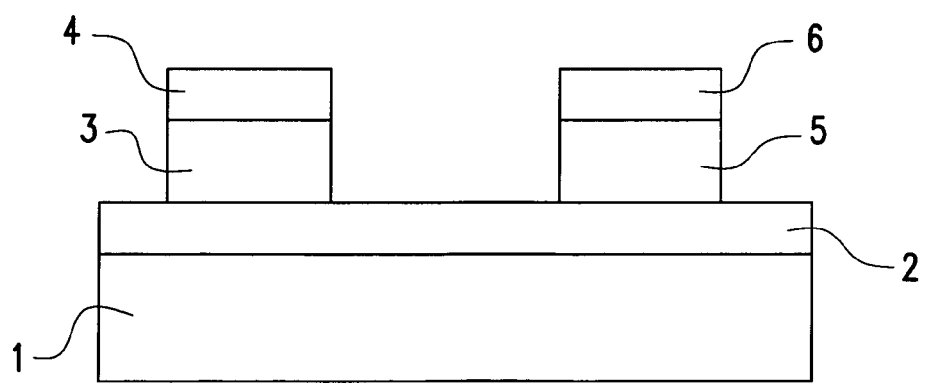
FIG. 4 is a structure diagram illustrating a light emitting device having a circuit protection unit in accordance with the present invention.
Figure 5:
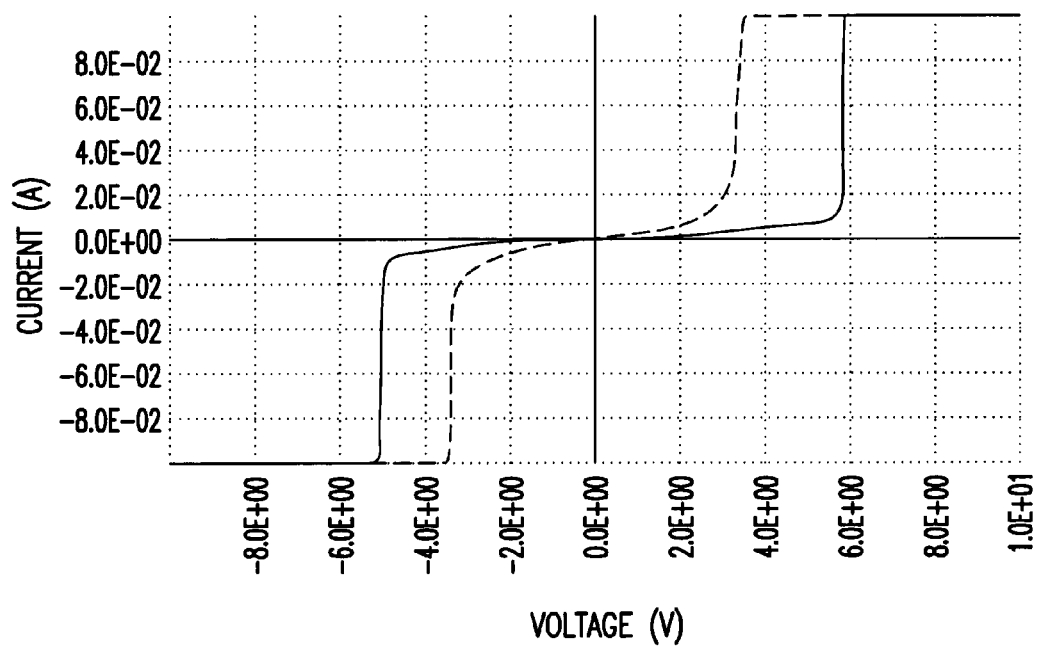
FIG. 5 is a chart illustrating the current-voltage relationship for the light emitting device in FIG. 4 in accordance with the present invention.

The light emitting device 1 may include the low-resistance layer 14 and the first potential barrier layer 16 only. In other embodiment of the present invention, the light emitting device 1 may include the low-resistance layer 14, the first potential barrier layer 16, the second low-resistance layer 17 and the second potential barrier layer 19. FIG. 5 is a diagram showing the current-voltage curve of the circuit protection unit shown in FIG. 4. Referring to FIG. 5, the dashed line illustrates the current-voltage curve of the circuit protection unit formed by the low-resistance layer 2, the first potential barrier layer 3 and the first electrode 4 shown in FIG. 4. The material of the low resistance layer 2 is indium tin oxide (ITO). The material of the first potential barrier layer 16 is p-type titanium dioxide having Cr dopant. The solid line shown in FIG. 5 illustrates the current-voltage curve of the circuit protection unit formed by the low-resistance layer 2, the first potential barrier layer 3, the first electrode 4, the second potential barrier layer 5, and the second electrode 6, as shown in FIG. 4. According to FIG. 5, a skilled artisan may change the number of circuit protection units to control the overall forward bias voltage and reverse breakdown voltage. Therefore, a plurality of low-resistance layers and potential barrier layers can be used in combination with the first potential barrier layer 16 and/or the second potential barrier layer 19 to meet users' needs.

Figure 6:
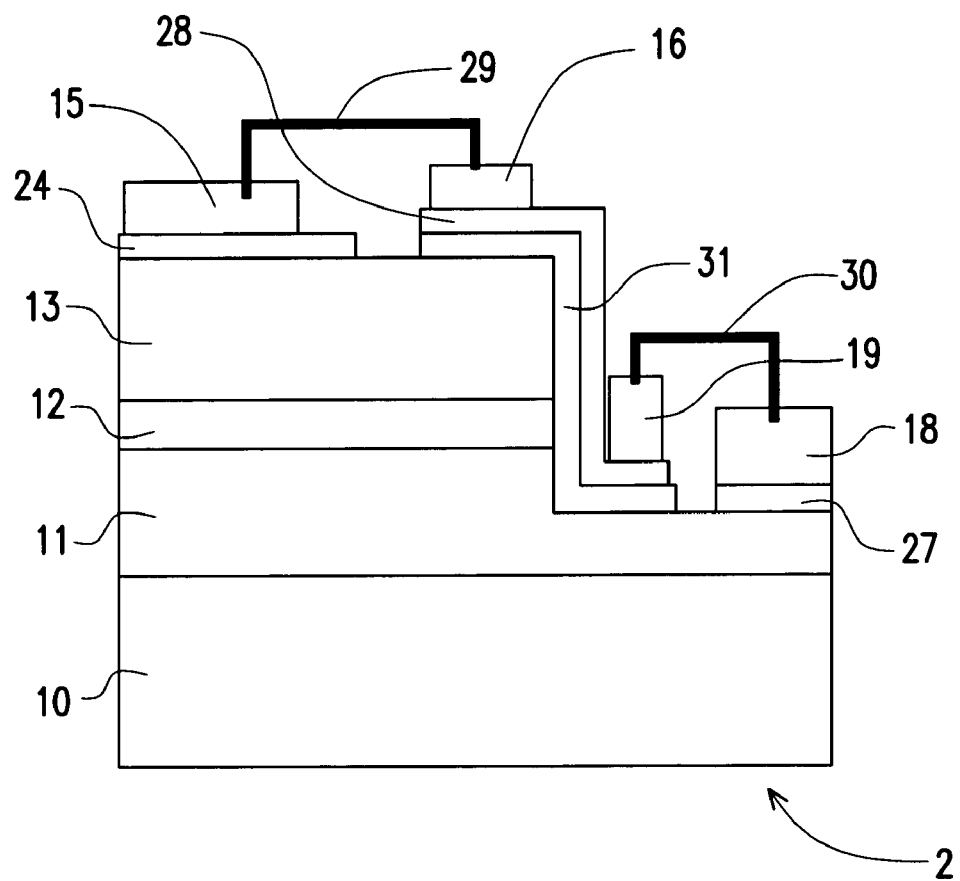
FIG. 6 is a schematic diagram illustrating a light emitting device having a circuit protection unit in accordance with a second embodiment of the present invention.

Referring to FIG. 6, a second light emitting device 2, in accordance with the second embodiment of the present invention, having circuit protection unit is illustrated. It should be noted that identical numericals represent the similar elements in FIGS. 3 and 6. Therefore, description related to these elements is omitted here. In the second light emitting device 2 of the second embodiment of the present invention, the second stacking layer 13 has a first contact region and a second contact region. A first ohmic contact layer 24 is formed on the first contact region of the second stacking layer 13. A first electrode 15 is disposed on the first ohmic contact layer 24, in which an ohmic contact is formed at the interface between the first ohmic contact layer 24 and the first electrode 15. The second surface has a third contact region and a fourth contact region. A second ohmic contact layer 27 is disposed on the third contact region. A second electrode 18 is disposed on the second ohmic contact layer 27, in which an ohmic contact is formed at the interface between the second ohmic layer 27 and the second electrode 18. An insulating layer 31 is formed over the second contact region, the sidewall of the first stacking layer 11, the light emitting layer 12 and the second stacking layer 13, and the fourth contact region for electrical insulation purposes. A first low-resistance layer 28 is disposed on the insulating layer 31. Furthermore, the first low-resistance layer 28 has a fifth contact region and a sixth contact region. A first potential barrier layer 16 is disposed on the fifth contact region. A barrier potential exists at the interface between the first low-resistance layer 28 and the potential barrier layer 16. The interface of the first low-resistance layer 28 and the first potential barrier layer 16 can be a Schottky contact or a p-n junction. A second potential barrier layer 19 is disposed on the sixth contact region, in which a barrier potential exists at the interface between the first low-resistance layer 28 and the second potential barrier layer 19. The interface of the first low-resistance layer 28 and the second potential barrier layer 19 can be a Schottky contact or a p-n junction. The first low-resistance layer 28 electrically connects the first potential barrier layer 16 and the second potential barrier layer 19 to form a circuit protection unit. A first electrical connecting layer 29 electrically connects the first electrode 15 and the first potential barrier layer 16. A second electrical connecting layer 30 electrically connects the second electrode 18 and the second potential barrier layer 19.

In the present embodiment, the second light emitting device 2 includes the first low-resistance layer 28 and the first potential barrier layer 16 only. In another embodiment of the present invention, the second light emitting device 2 may include the first low-resistance layer 28, the first potential barrier layer 16, the first low-resistance layer 28 and the second potential barrier layer 19. In an alternative embodiment of the present invention, a plurality of low-resistance layers and potential barrier layers can be disposed on the first potential barrier layer 16 and/or the second potential barrier layer 19 to meet requirements for the users.

Figure 7:
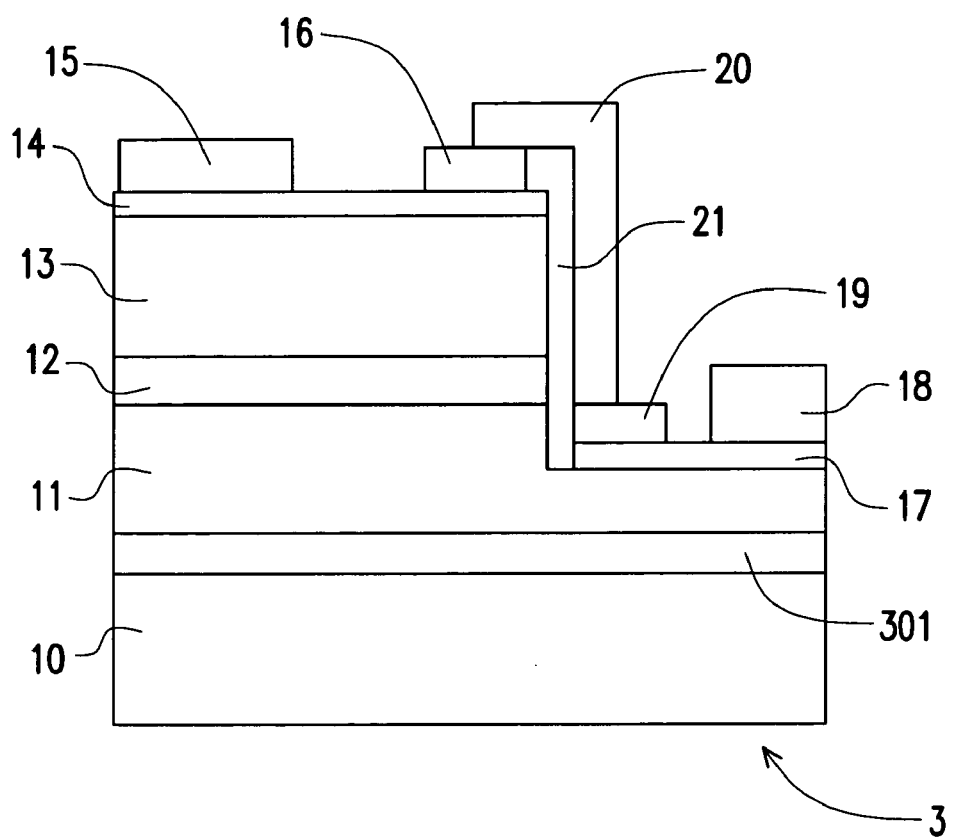
FIG. 7 is a schematic diagram illustrating a light emitting device having a circuit protection unit in accordance with a third embodiment of the present invention.

Referring to FIG. 7, the third light emitting device 3 having circuit protection unit, in accordance with the third embodiment of the present invention, is illustrated. It should be noted that identical numericals represent the same elements in FIGS. 3 FIG. 7. Therefore, description related to these elements is omitted here. In the light emitting device 3 as shown in FIG. 7, a bonding layer 310 is provided between the substrate 10 and the first stacking layer 11. The first stacking layer 11 is adhered onto the substrate 10 by wafer bonding technology.

In another embodiment of the present invention, the substrate 10 and the first stacking layer 11 are bonded directly under rising temperature and pressure without using the bonding layer 301. After the substrate 10 and the first stacking layer 11 are bonded directly under rising temperature and pressure, the first electrode and second electrode is disposed on opposite sides of the light emitting device. The layout of the circuit protection unit is described later.

The circuit protection unit and the layout of the electrodes for the third light emitting device 3 can be replaced by the circuit protection unit and the layout of the electrodes for the second light emitting device 2.

Figure 8:
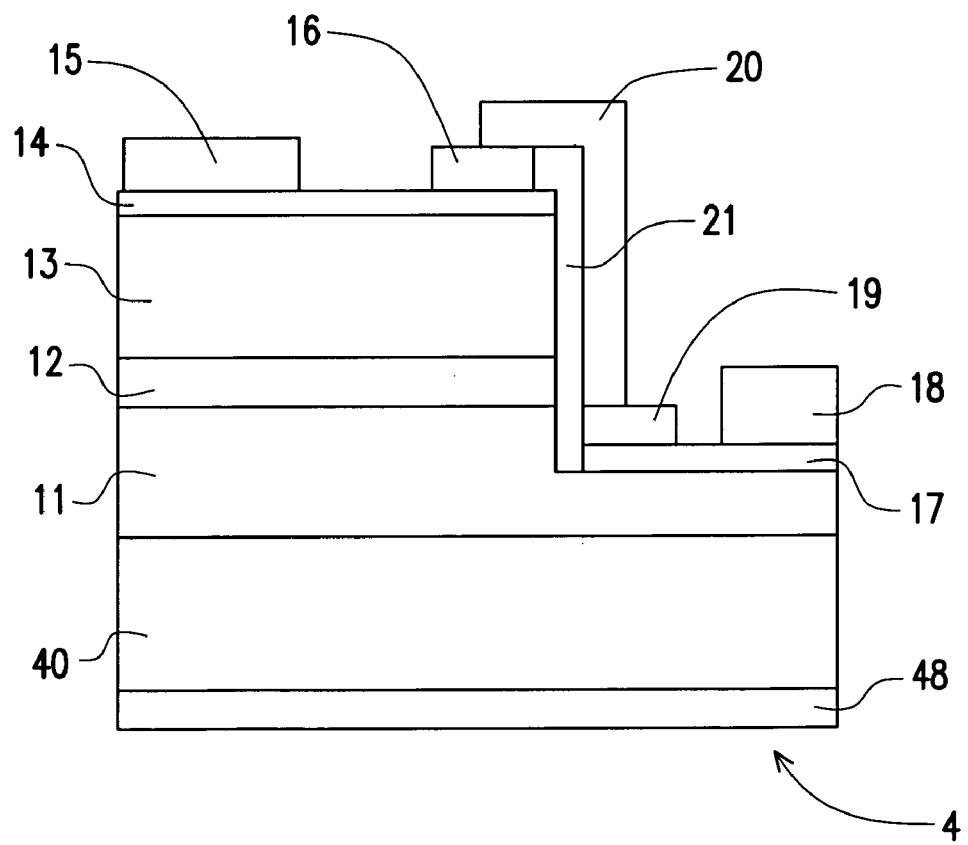
FIG. 8 is a schematic diagram illustrating a light emitting device having a circuit protection unit in accordance with a fourth embodiment of the present invention.

As shown in FIG. 8, the fourth light emitting device 4 having circuit protection unit, in accordance with the fourth embodiment of the present invention, is illustrated. It should be noted that identical numericals represent the same elements in FIGS. 3 8. Therefore, description related to these elements is omitted here. In the fourth light emitting device 4, a conductive substrate 40 is used for replacing the substrate 10 shown in FIG. 3. Furthermore, a second electrode 48 disposed on a lower surface of the conductive substrate 40 is used for replacing the first electrode 18 shown in FIG. 3. The fourth light emitting device 4 having the conductive substrate 40 and the second electrode 48 is an LED of a vertically arranged structure.

In the fourth light emitting device 4, the second low-resistance layer 17 and the second potential barrier layer 19 is disposed on the first stacking layer 11. In other words, the first stacking layer 11 and the second electrode 48 are disposed on opposite sides of the conductive substrate 40. In addition, the first potential barrier layer 16 and the second potential barrier layer 19 are electrically connected each other by the electrical connecting layer 20.

In another embodiment of the present invention, the fourth light emitting device 4 may include the first low-resistance layer 28 and the first potential barrier layer 16 only. And a circuit protection unit is formed by electrically connecting the first potential barrier layer 16 and the second electrode 48.

The first potential barrier layer 16 and second potential barrier layer 19 may be n-type layers or p-type layers. The first potential barrier layer 16 and the second potential barrier layer 19 are p-type layers when Mg, Zn, Be, Cr, or any other similar dopant is used. The first potential barrier layer 16 and the second potential barrier layer 19 are n-type layers when Si, Ge, Sn, Te, O, S, C, or any other dopant is used. The material of the first low-resistance layer 28 includes Ni/Au, NiO/Au, TiWN, TCO, ITO, CTO, $SnO_2Sb$, $ZnSnO_3$, $In_4Sn_3O_{12}$, $Zn_2SnO_4$, or any other similar material. The material of the second low-resistance layer 17 includes Ni/Au, NiO/Au, TiWN, TCO, ITO, CTO, $SnO_2Sb$, $ZnSnO_3$, $Zn_2SnO_4$, or any other similar material. The material of the first ohmic contact layer 24 includes Ni/Au, NiO/Au, TiWN, TCO, ITO, CTO, $SnO_2Sb$, $ZnSnO_3$, $Zn_2SnO_4$, or any other similar material. The material of the second ohmic contact layer includes Ni/Au, NiO/Au, TiWN, TCO, ITO, CTO, $SnO_2Sb$, $ZnSnO_3$, $Zn_2SnO_4$, or any other similar material. The first potential barrier layer 16 is a layer with a p-type dopant or an n-type dopant. The material of the potential barrier layer includes $TiO_2$, $SrTiO_3$, $FeTiO_3$, $MnTiO_3$, $BaTiO_3$, $ZrO_2$, $Nb_2O_5$, $KTaO_3$, $WO_3$, ZnO, $SnO_2$, GaP, Si, SiC, CdSe, CdS, or any other similar material. The second potential barrier layer 19 is a layer with a p-type dopant or an n-type dopant. The material of the potential barrier layer includes $TiO_2$, $SrTiO_3$, $FeTiO_3$, $MnTiO_3$, $BaTiO_3$, $ZrO_2$, $Nb_2O_5$, $KTaO_3$, $WO_3$, ZnO, $SnO_2$, GaP, Si, SiC, CdSe, CdS, or any other similar material. The material of the first stacking layer 11 includes group compounds such as AlInP, GaN, AlGaN, InGaN, or any other similar material. The material of the light emitting layer 12 includes a group III-V nitride-based semiconductor material such as AlGaInP, GaN, InGaN, or AlInGaN. The material of the second stacking layer 13 includes a GaN-based III-N group compound such as AlGaInP, GaN, AlInGaN, and InGaN. The barrier layer 19 includes $SiN_x$, $SiO_2$, or any other similar material. The material of the electrical connecting layer 20 includes Cr/Au, Ni/Au, Cr/Al, Ti/Al, Ti/Au, or any other similar material. The material of the first electrical connecting layer 29 includes Cr/Au, Ni/Au, Cr/Al, Ti/Al, Ti/Au, or any other similar material. The material of the second electrical connecting layer 30 includes Cr/Au, Ni/Au, Cr/Al, Ti/Al, Ti/Au, or any other similar materials. The material of the electrical connecting layer 20 includes polyimide, BCB, PFCB, or any other similar material. The material of the conductive substrate 40 includes GaP, SiC or any other similar material. The wafer bonding technology includes adhesive bonding, metal soldering, and direct bonding technology.

Although several embodiments of the present invention are shown, it will be apparent to those skilled in the art that various modifications and variations can be made to the structure of the present invention without departing from the scope or spirit of the invention. In view of the foregoing, it is intended that the present invention cover modifications and variations of the present invention provided they fall within the scope of the following claims and their equivalents.

The invention claimed is:

1. A light emitting device having a circuit protection unit, comprising:
    a light emitting stacking layer having a first surface and a second surface;
    a circuit protection unit comprising a first low-resistance layer and a first potential barrier layer, wherein the potential barrier layer is disposed on a portion of the first surface of the light emitting stacking layer, and a Schottky contact or a p-n junction exists at the interface between the first low-resistance layer and the first potential barrier layer, and the circuit protection unit electrically connects with the first surface and the second surface to provide a rectifying function;
    a conductive layer disposed over the potential barrier layer, wherein the conductive layer electrically connects the circuit protection unit with the first surface and the second surface to provide a rectifying function; and
    a first electrode disposed over another portion of the first surface and electrically connected with the first low-resistance layer.

2. A light emitting device having a circuit protection unit according to claim 1, wherein the first surface and the second surface are disposed over the same side of the light emitting stacking layer.

3. A light emitting device having a circuit protection unit according to claim 1, wherein the first surface and the second surface are disposed over opposite sides of the light emitting stacking layer respectively.

4. A light emitting device having a circuit protection unit according to claim 1, wherein the light emitting stacking layer comprising:
 a first stacking layer having the second surface,
 a light emitting layer, disposed over the first stacking layer, and
 a second stacking layer, disposed over the light emitting layer, wherein the second stacking layer comprises the first surface.

5. A light emitting device having a circuit protection unit according to claim 4, wherein the first stacking layer comprises a material selected from a group consisting of AlInP, GaN, AlGaN, and InGaN.

6. A light emitting device having a circuit protection unit according to claim 4, wherein the light emitting layer comprises a material selected from a group consisting of AlGaInP, GaN, InGaN, and AlInGaN.

7. A light emitting device having a circuit protection unit according to claim 4, wherein the second stacking layer comprises a material selected from a group consisting of AlInP, GaN, AlGaN, and InGaN.

8. A light emitting device having a circuit protection unit according to claim 1, wherein the first low-resistance layer comprises a material selected from a group consisting of Ni/Au, NiO/Au, TiWN, TCO, ITO, CTO, $SnO_2Sb$, $ZnSnO_3$, and $Zn_2SnO_4$.

9. A light emitting device having a circuit protection unit according to claim 1, wherein the first potential barrier layer comprises a material selected from a group consisting of $TiO_2$, $SrTiO_3$, $FeTiO_3$, $MnTiO_3$, $BaTiO_3$, $ZrO_2$, $Nb_2O_5$, $KTaO_3$, $WO_3$, ZnO, $SnO_2$, GaP, Si, SiC, CdSe, and CdS.

10. A light emitting device having a circuit protection unit according to claim 1, wherein the first potential barrier layer comprises a layer with a p-type dopant or an n-type dopant.

11. A light emitting device having a circuit protection unit according to claim 10, wherein the dopant in the first potential barrier layer comprises a material selected from a group consisting of Mg, Zn, Be, and Cr.

12. A light emitting device having a circuit protection unit according to claim 10, wherein the dopant in the first potential barrier layer comprises a material selected from a group consisting of Si, Ge, Sn, Te, O, S, and C.

13. A light emitting device having a circuit protection unit according to claim 1, wherein the first low-resistance layer of the circuit protection unit is disposed over the first surface.

14. A light emitting device having a circuit protection unit according to claim 13, wherein the first low-resistance layer comprising a first contact region and a second contact region, and the first potential barrier layer is disposed over the second contact region.

15. A light emitting device having a circuit protection unit according to claim 14, further comprising a second low-resistance layer and a second potential barrier layer, wherein the second low-resistance layer has a third contact region and a fourth contact region, the second low-resistance layer is disposed over the second surface, and the second potential barrier layer is disposed over the fourth contact region.

16. A light emitting device having a circuit protection unit according to claim 15, wherein an interface between the second low-resistance layer and the second potential barrier layer comprising a Schottky contact or a p-n junction.

17. A light emitting device having a circuit protection unit according to claim 15, further comprising a second electrode disposed over the third contact region of the second low-resistance layer.

18. A light emitting device having a circuit protection unit according to claim 15, wherein the conductive layer is an electrical connecting layer electrically connected to the first potential barrier layer and the second potential barrier layer.

19. A light emitting device having a circuit protection unit according to claim 18, wherein the electrical connecting layer comprises a material selected from a group consisting of Cr/Au, Ni/Au, Cr/Al, Ti/Al, and Ti/Au.

20. A light emitting device having a circuit protection unit according to claim 15, wherein the second low-resistance layer comprises a material selected from a group consisting of Ni/Au, NiO/Au, TiWN, TCO, ITO, CTO, $SnO_2Sb$, $ZnSnO_3$, and $Zn_2SnO_4$.

21. A light emitting device having a circuit protection unit according to claim 15, wherein the second potential barrier layer comprises a material selected from a group consisting of $TiO_2$, $SrTiO_3$, $FeTiO_3$, $MnTiO_3$, $BaTiO_3$, $ZrO_2$, $Nb_2O_5$, $KTaO_3$, $WO_3$, ZnO, $SnO_2$, GaP, Si, SiC, CdSe, and CdS.

22. A light emitting device having a circuit protection unit according to claim 15, further comprising at least one low-resistance layer and at least one potential barrier layers disposed over the second potential barrier layer.

23. A light emitting device having a circuit protection unit according to claim 14, wherein the first electrode is disposed over the first contact region of the first low-resistance layer.

24. A light emitting device having a circuit protection unit according to claim 1, further comprising an insulating layer, wherein the first surface has a first contact region and a second contact region, the second surface has a third contact region and a fourth contact region, the insulating layer is disposed over the second contact region, the fourth contact region, and the sidewall of the light emitting stacking layer such that the circuit protection unit is electrically isolated from the second contact region, the fourth contact region, and the light emitting stacking layer.

25. A light emitting device having a circuit protection unit according to claim 24, further comprising a second potential barrier layer, wherein the first low-resistance layer of the circuit protection unit is disposed over the insulating layer, the first low-resistance layer has of a fifth contact region and a sixth contact region, the first potential barrier layer is disposed over the fifth contact region, and the second potential barrier layer is disposed over the sixth contact region.

26. A light emitting device having a circuit protection unit according to claim 25, wherein an interface of the first low-resistance layer and the second potential barrier layer comprises a Schottky contact or a p-n junction.

27. A light emitting device having a circuit protection unit according to claim 26, further comprising a first ohmic contact layer disposed over the first contact region of the first surface.

28. A light emitting device having a circuit protection unit according to claim 27, wherein the first electrode is disposed over the first ohmic contact layer.

29. A light emitting device having a circuit protection unit according to claim 28, further comprising a second ohmic contact layer disposed over the third contact region of the second surface.

30. A light emitting device having a circuit protection unit according to claim 29, further comprising a second electrode disposed over the second ohmic contact layer.

31. A light emitting device having a circuit protection unit according to claim 30, wherein the conductive layer further comprises a first electrical connecting layer electrically connected to the first potential barrier layer and the first electrode.

32. A light emitting device having a circuit protection unit according to claim 31, wherein the conductive layer further comprises a second electrical connecting layer electrically connected to the second potential barrier layer and the second electrode.

33. A light emitting device having a circuit protection unit according to claim 32, wherein the second electrical connecting layer comprises a material selected from a group consisting of Cr/Au, Ni/Au, Cr/Al, Ti/Al, and Ti/Au.

34. A light emitting device having a circuit protection unit according to claim 31, wherein the first electrical connecting layer comprises a material selected from a group consisting of Cr/Au, Ni/Au, Cr/Al, Ti/Al, and Ti/Au.

35. A light emitting device having a circuit protection unit according to claim 29, wherein the second ohmic contact layer comprises a material selected from a group consisting of Ni/Au, NiO/Au, TiWN, TCO, ITO, CTO, $SnO_2Sb$, $ZnSnO_3$, and $Zn_2SnO_4$.

36. A light emitting device having a circuit protection unit according to claim 27, wherein the first ohmic contact layer comprises a material selected from a group consisting of Ni/Au, NiO/Au, TiWN, TCO, ITO, CTO, $SnO_2Sb$, $ZnSnO_3$, and $Zn_2SnO_4$.

37. A light emitting device having a circuit protection unit according to claim 25, wherein the second potential barrier layer comprises a material selected from a group consisting of $TiO_2$, $SrTiO_3$, $FeTiO_3$, $MnTiO_2$, $BaTiO_3$, $ZrO_2$, $Nb_2O_5$, $KTaO_3$, $WO_3$, ZnO, $SnO_2$, GaP, Si, SiC, CdSe, and CdS.

38. A light emitting device having a circuit protection unit according to claim 25, wherein the first potential barrier layer comprises layer with a p-type dopant or an n-type dopant.

39. A light emitting device having a circuit protection unit according to claim 38, wherein the dopant in the first potential barrier layer comprises a material selected from a group consisting of Mg, Zn, Be, and Cr.

40. A light emitting device having a circuit protection unit according to claim 38, wherein the dopant in the first potential barrier layer comprises a material selected from a group consisting of Si, Ge, Sn, Te, O, S, and C.

41. A light emitting device having a circuit protection unit according to claim 25, wherein the second potential barrier layer comprises a p-type dopant or an n-type dopant.

42. A light emitting device having a circuit protection unit according to claim 41, wherein the dopant in the first potential barrier layer comprises a material selected from a group consisting of Mg, Zn, Be, and Cr.

43. A light emitting device having a circuit protection unit according to claim 41, wherein the dopant in the first potential barrier layer comprises a material selected from a group consisting of Si, Ge, Sn, Te, O, S, and C.

44. A light emitting device having a circuit protection unit according to claim 25, further comprising at least one low-resistance layer and at least one potential barrier layer disposed over the second potential barrier layer.

45. A light emitting device having a circuit protection unit according to claim 24, wherein the insulating layer comprises $SiN_x$ or $SiO_2$.

46. A light emitting device having a circuit protection unit according to claim 1, further comprising at least one additional circuit protection unit disposed over the circuit protection unit.

47. A light emitting device having a circuit protection unit according to claim 1, wherein the first low-resistance layer is metal with work function $\Phi L$, the first potential barrier layer is n-type semiconductor with work function $\Phi B$, wherein $\Phi L > \Phi B$.

48. A light emitting device having a circuit protection unit according to claim 1, wherein the first low-resistance layer is metal with work function $\Phi L$, the first potential barrier layer is p-type semiconductor with work function $\Phi B$, wherein $\Phi L < \Phi B$.

49. A light emitting device having a circuit protection unit according to claim 1, wherein the first low-resistance layer comprises TCO with work function $\Phi L$, the first potential barrier layer comprises n-type semiconductor with work function $\Phi B$, wherein $\Phi L > \Phi B$.

50. A light emitting device having a circuit protection unit according to claim 1, wherein the first low-resistance layer comprises TCO with work function $\Phi L$, the first potential barrier layer comprises p-type semiconductor with work function $\Phi B$, wherein $\Phi L < \Phi B$.

51. A light emitting device having a circuit protection unit according to claim 1, wherein the first low-resistance layer comprises n-type semiconductor with work function $\Phi L$, the first potential barrier layer comprises p-type semiconductor with work function $\Phi B$, wherein $\Phi L < \Phi B$.

52. A light emitting device having a circuit protection unit according to claim 1, wherein the light emitting stacking layer is bonded onto a substrate by wafer bonding technology.

53. A light emitting device having a circuit protection unit according to claim 52, wherein the light emitting stacking layer is bonded onto the substrate via a connecting layer.

54. A light emitting device having a circuit protection unit according to claim 53, wherein the electrical connecting layer comprises a material selected from a group consisting of polyimide, BCB, and PFCB.

55. A light emitting device having a circuit protection unit according to claim 52, wherein the wafer bonding technology comprises adhesive bonding, metal soldering, or direct bonding.

56. A light emitting device having a circuit protection unit according to claim 1, wherein the light emitting stacking layer is disposed over a surface of a conductive substrate.

57. A light emitting device having a circuit protection unit according to claim 56, wherein the first low-resistance layer of the circuit protection unit is in contact with the first surface, the first low-resistance layer has a first contact region and a second contact region.

58. A light emitting device having a circuit protection unit according to claim 57, wherein the first potential barrier layer is disposed over the first contact region of the first low-resistance layer.

59. A light emitting device having a circuit protection unit according to claim 58, wherein the first electrode is disposed over the second contact region of the first low-resistance layer.

60. A light emitting device having a circuit protection unit according to claim 59, further comprising a second low-resistance layer disposed over a contact region of the second surface.

61. A light emitting device having a circuit protection unit according to claim 60, further comprising a second electrode disposed over a lower surface of the substrate.

62. A light emitting device having a circuit protection unit according to claim 56, wherein the conductive substrate comprises GaP or SiC.

63. A light emitting device having a circuit protection unit, comprising:

a light emitting stacking layer having a first surface, a second surface, and a sidewall surface connecting the first surface and the second surface;

a circuit protection unit for providing a rectifying function comprising a low-resistance layer disposed on a portion of the first surface, a potential barrier layer disposed on the low-resistance layer, and an electrical connecting layer disposed at least on the sidewall surface for electrically connecting the circuit protection unit with the first surface and the second surface; and a first electrode disposed over another portion of the first surface and electrically connected with the first low-resistance layer, wherein a Schottky contact or a p-n junction exists at the interface between the low-resistance layer and the potential barrier layer.

64. A light emitting device having a circuit protection unit according to claim 63, wherein the low-resistance layer is metal with work function $\Phi L$, the potential barrier layer is n-type semiconductor with work function $\Phi B$, wherein $\Phi L > \Phi B$.

65. A light emitting device having a circuit protection unit according to claim 63, wherein the low-resistance layer is metal with work function $\Phi L$, the potential barrier layer is p-type semiconductor with work function $\Phi B$, wherein $\Phi L < \Phi B$.

66. A light emitting device having a circuit protection unit according to claim 63, wherein the low-resistance layer comprises TCO with work function $\Phi L$, the potential barrier layer is n-type semiconductor with work function $\Phi B$, wherein $\Phi L > \Phi B$.

67. A light emitting device having a circuit protection unit according to claim 63, wherein the low-resistance layer comprises TCO with work function $\Phi L$, the potential barrier layer is p-type semiconductor with work function $\Phi B$, wherein $\Phi L < \Phi B$.

68. A light emitting device having a circuit protection unit according to claim 63, wherein the low-resistance layer comprises n-type semiconductor with work function $\Phi L$, the potential barrier layer is p-type semiconductor with work function $\Phi B$, wherein $\Phi L < \Phi B$.

* * * * *